(12) United States Patent
Chen et al.

(10) Patent No.: US 9,496,048 B2
(45) Date of Patent: Nov. 15, 2016

(54) DIFFERENTIAL ONE-TIME-PROGRAMMABLE (OTP) MEMORY ARRAY

(71) Applicant: QUALCOMM Incorporated, San Diego, CA (US)

(72) Inventors: Xiaonan Chen, San Diego, CA (US); Zhongze Wang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/656,699

(22) Filed: Mar. 12, 2015

(65) Prior Publication Data
US 2016/0268002 A1     Sep. 15, 2016

(51) Int. Cl.
    G11C 17/08     (2006.01)
(52) U.S. Cl.
    CPC ..................... G11C 17/08 (2013.01)
(58) Field of Classification Search
    CPC ............. G11C 2216/26; G11C 17/08
    See application file for complete search history.

(56) References Cited

U.S. PATENT DOCUMENTS

| | | | |
|---|---|---|---|
| 5,410,501 A * | 4/1995 | Golke | G11C 17/12 365/104 |
| 6,950,342 B2 | 9/2005 | Lindhorst et al. | |
| 7,715,247 B2 | 5/2010 | Kim | |
| 8,040,748 B2 | 10/2011 | Buer et al. | |
| 8,324,663 B2 | 12/2012 | Qiu et al. | |
| 8,659,322 B2 | 2/2014 | Hoefler et al. | |
| 2003/0151945 A1* | 8/2003 | Tanzawa | G11C 16/30 365/185.01 |
| 2005/0169040 A1* | 8/2005 | Peng | G11C 11/405 365/149 |
| 2009/0250726 A1 | 10/2009 | Kurjanowicz | |
| 2011/0134680 A1* | 6/2011 | Saito | G11C 17/12 365/104 |
| 2012/0211841 A1 | 8/2012 | Kurjanowicz | |
| 2012/0314473 A1 | 12/2012 | Chung | |
| 2013/0194885 A1* | 8/2013 | Peng | G11C 17/16 365/206 |
| 2014/0001568 A1* | 1/2014 | Wang | H01L 27/11286 257/379 |
| 2015/0138869 A1* | 5/2015 | Chiu | G11C 17/123 365/104 |

OTHER PUBLICATIONS

Kilopass Technology, "UMC's Poly SiON and High-k/metal Gate Processes," May 28, 2013, Retrieved date on May 22, 2014, Retrieved from the Internet < URL : http://www.kilopass.com/kilopass-and-umc-align-for-advanced-28nm-ip/ >, 5 pages.

Shen W.C., et al., "High-K metal gate contact RRAM (CRRAM) in pure 28nm CMOS logic process," IEEE International Electron Devices Meeting (IEDM), 2012, pp. 31.6.1 to 31.6.4.

* cited by examiner

*Primary Examiner* — Khamdan Alrobaie
(74) *Attorney, Agent, or Firm* — Muncy, Geissler, Olds & Lowe, P.C.

(57) ABSTRACT

An OTP memory array includes a plurality of differential P-channel metal oxide semiconductor (PMOS) OTP memory cells programmable and readable in predetermined states of program and read operations, and is capable of providing sufficient margins against global process variations and temperature variations while being compatible with standard logic fin-shaped field effect transistor (Fin-FET) processes to obviate the need for additional masks and costs associated with additional masks.

20 Claims, 7 Drawing Sheets

DIFFERENTIAL ONE-TIME-PROGRAMMABLE (OTP) MEMORY ARRAY

FIELD OF DISCLOSURE

Various embodiments described herein relate to one-time-programmable (OTP) memories, and more particularly, to differential OTP memory arrays.

BACKGROUND

Various attempts have been made to design threshold-voltage-($V_T$)-shift-based one-time-programmable (OTP) memory cells by utilizing fin-shaped field effect transistor (FinFET) processes. Attempts have also been made to design OTP memory cells with reliable repeatable programming behavior across wafer and process variations as well as temperature variations. However, switch windows in conventional FinFET-based OTP memory cells may be very sensitive to global process variations. Moreover, conventional OTP memory arrays may require large numbers of latching circuits or sense amplifiers for read operations, thereby necessitating relatively large circuit layouts and relatively low array densities.

SUMMARY

Exemplary embodiments of the disclosure are directed to one-time-programmable (OTP) memory arrays having differential OTP memory cells.

In an embodiment, a differential one-time-programmable (OTP) memory is provided, the differential OTP memory comprising: a first transistor and a second transistor coupled to each other, wherein each of the first and second transistors comprises a source, a drain and a gate, wherein each of the first and second transistors is configured to operate in one of four states of a program operation, wherein each of the four states of the program operation comprises a unique set of a source voltage, a drain voltage and a gate voltage, wherein the gate voltage is either a first word line voltage in first and second of the four states of the program operation or a second word line voltage in third and fourth of the four states of the program operation, and wherein the source voltage is either a first source voltage in the first and third of the four states of the program operation or a second source voltage in the second and fourth of the four states of the program operation.

In another embodiment, a differential one-time-programmable (OTP) memory is provided, the differential OTP memory comprising: a plurality of differential memory cells each comprising at least a first P-channel metal oxide semiconductor (PMOS) transistor and a second PMOS transistor coupled to each other, wherein each of the first and second PMOS transistors comprises a source, a drain and a gate, wherein each of the first and second PMOS transistors is configured to operate in one of four states of a program operation, wherein each of the four states of the program operation comprises a unique set of a source voltage, a drain voltage and a gate voltage, wherein each of the first and second PMOS transistors is configured to operate in one of two states of a read operation, and wherein each of the two states of the read operation comprises a unique set of a source voltage, a drain voltage and a gate voltage.

In yet another embodiment, a one-time-programmable (OTP) memory is provided, the OTP memory comprising: a plurality of word lines; a plurality of bit lines; a plurality of differential memory cells each comprising at least a first P-channel metal oxide semiconductor (PMOS) transistor and a second PMOS transistor, wherein each of the first and second PMOS transistors comprises a source, a drain and a gate, wherein the gate of the first PMOS transistor and the gate of the second PMOS transistor are coupled to one of the word lines, wherein the drain of the first PMOS transistor is coupled to a first one of the bit lines and the drain of the second PMOS transistor is coupled to a second one of the bit lines, wherein each of the first and second PMOS transistors is configured to operate in one of four states of a program operation, wherein each of the four states of the program operation comprises a unique set of a source voltage, a drain voltage and a gate voltage, wherein each of the first and second PMOS transistors is configured to operate in one of two states of a read operation, and wherein each of the two states of the read operation comprises a unique set of a source voltage, a drain voltage and a gate voltage; and a latching circuit coupled to the first and second bit lines.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
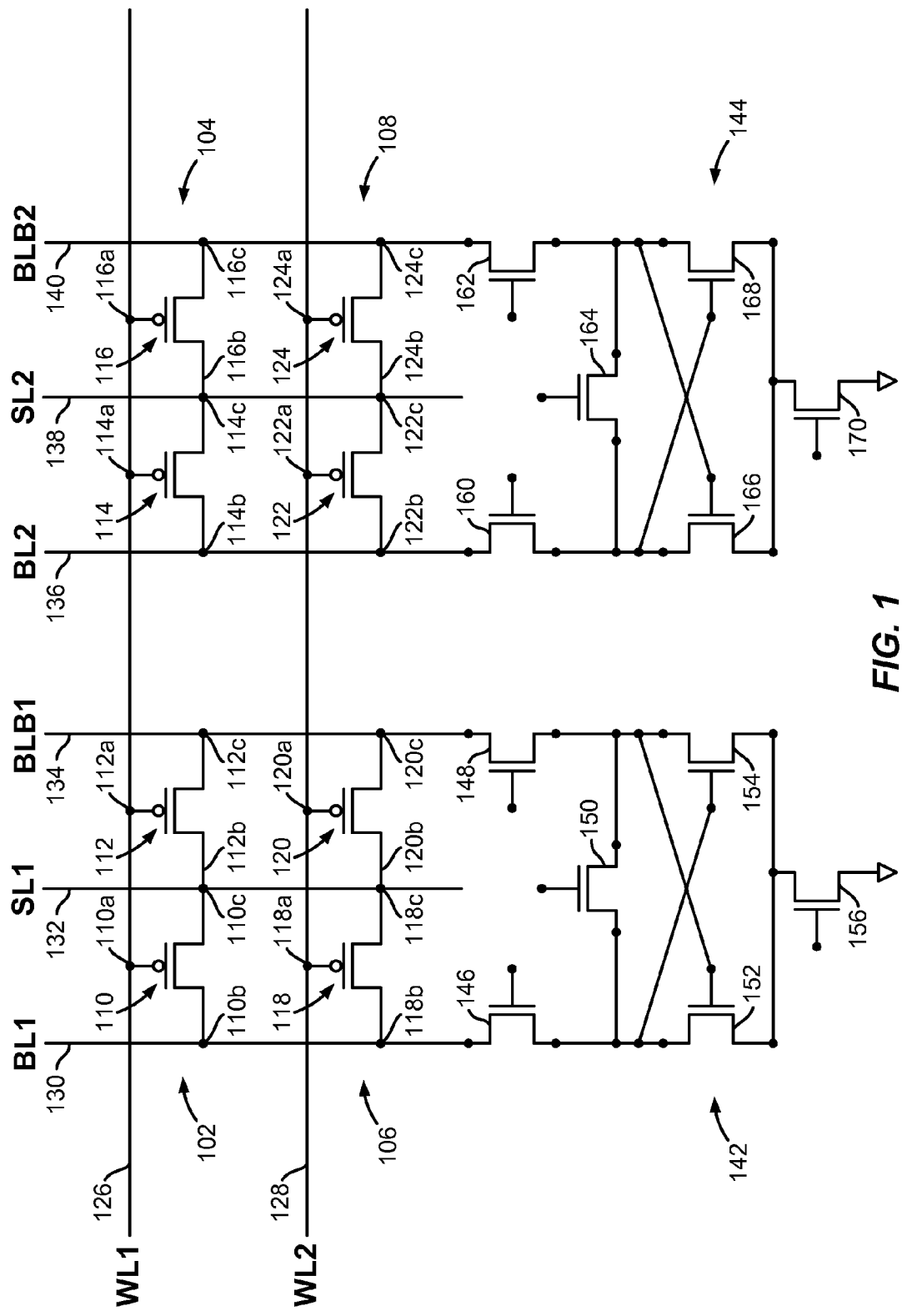
FIG. 1 is a circuit diagram illustrating an embodiment of a memory array comprising a plurality of one-time-programmable (OTP) memory cells.

FIG. 1 is a circuit diagram illustrating an embodiment of a memory array comprising a plurality of one-time-programmable (OTP) memory cells 102, 104, 106 and 108. In the embodiment shown in FIG. 1, each of the OTP memory cells comprises two transistors, and more particularly, two P-channel metal oxide semiconductor (PMOS) transistors. Such a two-transistor memory cell is also called a 2T cell. In FIG. 1, the first OTP memory cell 102 comprises PMOS transistors 110 and 112, the second OTP memory cell 104 comprises PMOS transistors 114 and 116, the third OTP memory cell 106 comprises PMOS transistors 118 and 120, and the fourth OTP memory cell 108 comprises PMOS transistors 122 and 124. Although FIG. 1 only shows two rows and two columns of OTP memory cells 102, 104, 106 and 108, multiple rows and columns of OTP memory cells may include the embodiment within the scope of the disclosure.

In FIG. 1, the PMOS transistor 110 has a gate 110a and source/drain terminals 110b and 110c, while the PMOS transistor 112 has a gate 112a and source/drain terminals 112b and 112c in the first OTP memory cell 102. Similarly, the PMOS transistor 114 has a gate 114a and source/drain terminals 114b and 114c, while the PMOS transistor 116 has a gate 116a and source/drain terminals 116b and 116c in the second OTP memory cell 104. In the third OTP memory cell 106, the PMOS transistor 118 has a gate 118a and source/drain terminals 118b and 118c, while the PMOS transistor 120 has a gate 120a and source/drain terminals 120b and 120c. In the fourth OTP memory cell 108, the PMOS transistor 122 has a gate 122a and source/drain terminals 122b and 122c, while the PMOS transistor 124 has a gate 124a and source/drain terminals 124b and 124c. In an embodiment, the gates 110a and 112a of the PMOS transistors 110 and 112 as well as the gates 114a and 116a of the PMOS transistors 114 and 116 in the first row of OTP memory cells 102 and 104 are connected to a first word line (WL1) 126. In a similar manner, the gates 118a and 120a of the PMOS transistors 118 and 120 as well as the gates 122a and 124a of the PMOS transistors 122 and 124 in the second row of OTP memory cells 106 and 108 are connected to a second word line (WL2) 128.

As shown in FIG. 1, a plurality of vertical lines 130, 132, 134, 136, 138 and 140 are connected to respective source/drain terminals of PMOS transistors in respective columns of OTP memory cells. It is known to persons skilled in the art that, in a typical PMOS transistor, the drain and the source are both P+ doped regions which are interchangeable depending on the bias voltages applied and the current flow. A line that supplies a voltage to a source of a PMOS transistor in an OTP memory cell is typically called a source line, whereas a line that is connected to the drain of a PMOS transistor in an OTP memory cell is typically called a bit line. In FIG. 1, which illustrates an embodiment of an OTP memory array in a read operation, line 132 serves as a source line SL1 for the PMOS transistors 110 and 112 in the first OTP memory cell 102 and the PMOS transistors 118 and 120 in the third OTP memory cell 106, whereas line 138 serves as a source line SL2 for the PMOS transistors 114 and 116 in the second OTP memory cell 104 and the PMOS transistors 122 and 124 in the fourth OTP memory cell 106. In such a read operation, the source/drain terminals 110c, 112b, 118c, 120b, 114c, 116b, 122c and 124b serve as the sources of their respective PMOS transistors. Embodiment of read operations of OTP memory cells will be described in further detail with respect to FIGS. 6A-D and FIG. 7 below.

Referring to the embodiment of the OTP memory array in a read operation in FIG. 1, lines 130 and 136 serve as bit lines BL1 and BL2, respectively, whereas lines 134 and 140 serve as complementary bit lines BLB1 and BLB2 that are complements of bit lines BL1 and BL2, respectively. In FIG. 1, bit line 130 is connected to the source/drain terminals 110b and 118b, which serve as the drains of the PMOS transistors 110 and 118, respectively, in a read operation. Complementary bit line 134 is connected to the source/drain terminals 112c and 120c, which serve as the drains of the PMOS transistors 112 and 120, respectively, in a read operation. In a similar manner, bit line 136 is connected to the source/drain terminals 114b and 122b, which serve as the drains of the PMOS transistors 114 and 122, respectively, in a read operation. Furthermore, complementary bit line 140 is connected to the source/drain terminals 116c and 124c, which serve as the drains of the PMOS transistors 116 and 124, respectively, in a read operation.

In the embodiment illustrated in FIG. 1, the OTP memory array further comprises a plurality of latching circuits each coupled to the drains of a respective row of OTP memory cells. For example, a first latching circuit 142 is coupled to the drains 110b and 118b of the PMOS transistors 110 and 118 through bit line BL1, as well as to the drains 112c and 120c of the PMOS transistors 112 and 120 through complementary bit line BLB1 in the first and third OTP memory cells 102 and 106. In a similar manner, a second latching circuit 144 is coupled to the drains 114b and 122b of the PMOS transistors 114 and 122 through bit line BL2, as well as to the drains 116c and 124c of the PMOS transistors 116 and 124 through complementary bit line BLB2 in the second and fourth OTP memory cells 104 and 108.

In an embodiment, each of the latching circuits comprises a plurality of N-channel metal oxide semiconductor (NMOS) transistors. In the embodiment illustrated in FIG. 1, the first latching circuit 142 comprises NMOS transistors 146, 148 and 150, two cross-coupled NMOS transistors 152 and 154, and an NMOS transistor 156 connected to the cross-coupled NMOS transistors 152 and 154. In a similar manner, the second latching circuit 144 comprises NMOS transistors 160, 162 and 164, two cross-coupled NMOS transistors 166 and 168, and an NMOS transistor 170 connected to the cross-coupled NMOS transistors 166 and 168. Other types of latching circuits may also be implemented in alternate embodiments. Instead of latching circuits, sense amplifiers may also be implemented in other embodiments within the scope of the disclosure.

Figure 2:
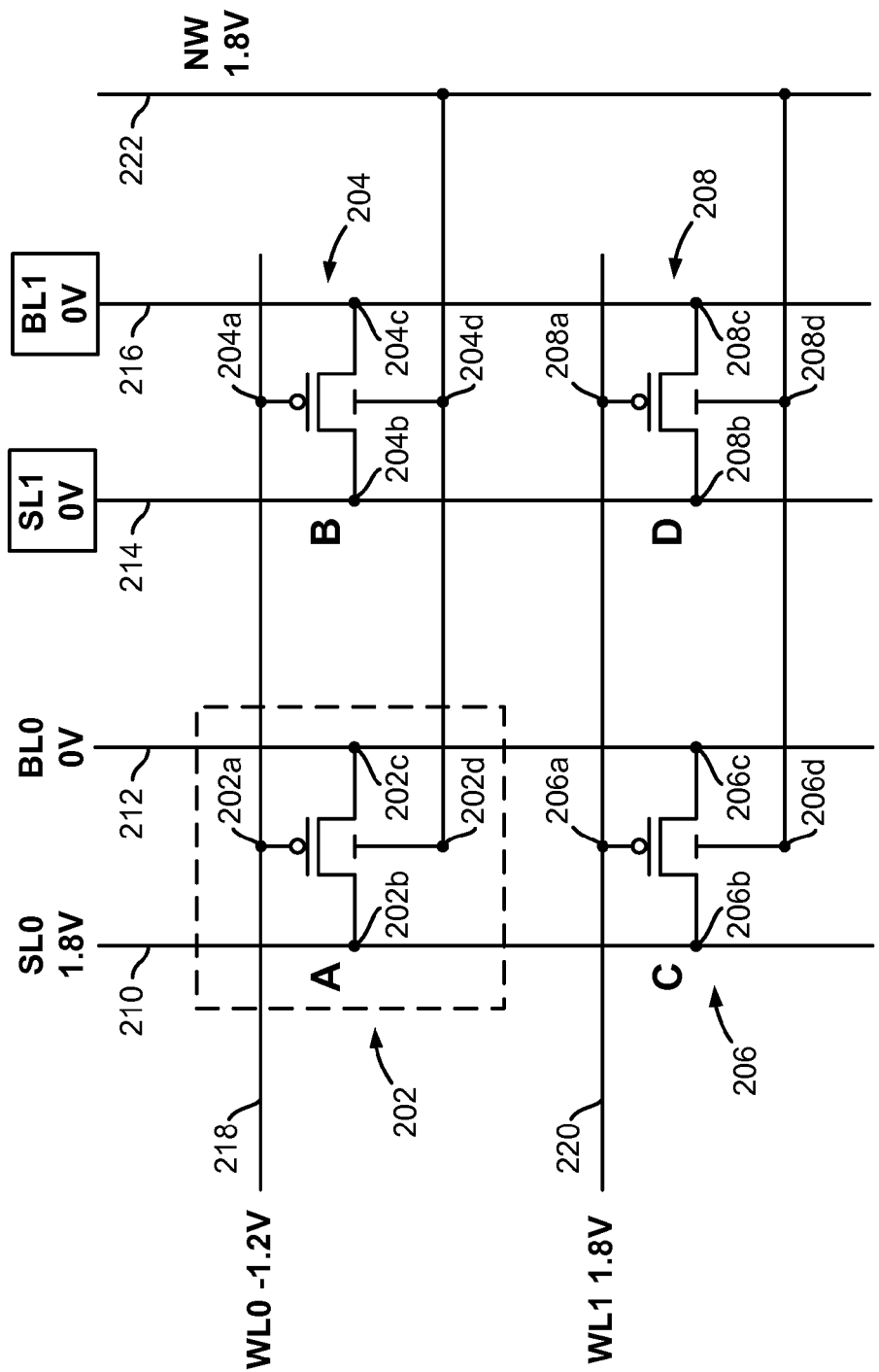
FIG. 2 is a circuit diagram illustrating an OTP memory structure having four single-transistor (1T) OTP memory cells configured to operate in four states, namely, the A, B, C and D states, of exemplary program conditions.

FIG. 2 is a circuit diagram illustrating an OTP memory structure having four single-transistor OTP memory cells, also called 1T cells, wherein each of the OTP memory cells comprises a single PMOS transistor configured to operate in one of four states, namely, the A state, the B state, the C state and the D state, of exemplary program conditions. As illustrated in FIG. 2, a first PMOS transistor 202 having a gate 202a, a source 202b, a drain 202c and an N-well 202d operates in the A state, a second PMOS transistor 204 having a gate 204a, a source 204b, a drain 204c and an N-well 204d operates in the B state, a third PMOS transistor 206 having a gate 206a, a source 206b, a drain 206c and an N-well 206d operates in the C state, and a fourth PMOS transistor 208 having a gate 208a, a source 208b, a drain 208c and an N-well 208d operates in the D state.

In FIG. 2, a first source line (SL0) 210 is connected to the sources 202b and 206b, and a first bit line (BL0) 212 is connected to the drains 202c and 206c of the first and third PMOS transistors 202 and 206 in the first column, respectively. Similarly, a second source line (SL1) 214 is connected to the sources 204b and 208b, and a second bit line (BL1) 216 is connected to the drains 204c and 208c of the second and fourth PMOS transistors 204 and 208 in the second column, respectively. Moreover, a first word line (WL0) 218 is connected to the gates 202a and 204a of the first and second PMOS transistors 202 and 204 in the first row, respectively, whereas a second word line (WL1) 220 is connected to the gates 206a and 208a of the third and fourth PMOS transistors 206 and 208 in the second row, respectively. Furthermore, the N-wells 202d, 204d, 206d and 208d of the first, second, third and fourth PMOS transistors 202, 204, 206 and 208 are connected to an N-well line (NW) 222.

In an embodiment, the first word line (WL0) 218 is applied a negative voltage, for example, a voltage of approximately −1.2V, whereas the second word line (WL1) 220 is applied a positive voltage, for example, a voltage of approximately +1.8V, in program conditions. In an embodiment, the first source line (SL0) 210 is applied a positive voltage, for example, a voltage of approximately +1.8V, whereas the first bit line (BL0) 212, the second source line (SL1) 214 and the second bit line (BL1) 216 have a voltage of approximately 0V. In an embodiment, the N-well line (NW) 222 is applied a positive voltage of approximately +1.8V, which is supplied to the N-wells of all PMOS transistors in program conditions regardless of whether each PMOS transistor is in the A state, the B state, the C state or the D state.

Figure 3A:
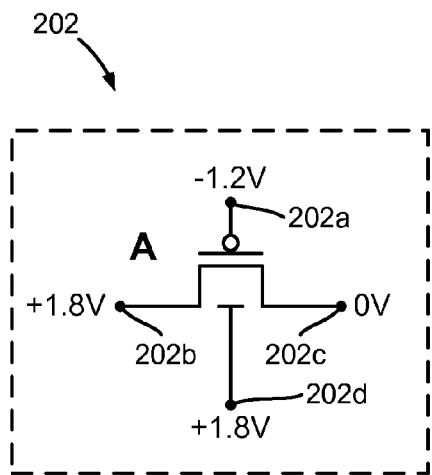
FIGS. 3A-D illustrate the voltages at the gate, source, drain and N-well of four PMOS transistors in the A, B, C and D states of exemplary program conditions, respectively.

FIGS. 3A-D each illustrate the voltages at the gate, source, drain and N-well of each of the four PMOS transistors 202, 204, 206 and 208 in the A, B, C and D states of exemplary program conditions, respectively. In FIG. 3A, which illustrates a PMOS transistor 202 in the A state of a program operation, the gate 202a of the PMOS transistor 202 has a voltage of approximately −1.2V, which may be supplied from a word line in an embodiment, the source 202b of the PMOS transistor 202 has a voltage of approximately +1.8V, which may be supplied from a source line in an embodiment, the drain 202c of the PMOS transistor 202 has a voltage of approximately 0V, and the N-well 202d of the PMOS transistor 202 has a voltage of approximately +1.8V, which may be supplied from an N-well line in an embodiment.

Figure 3B:
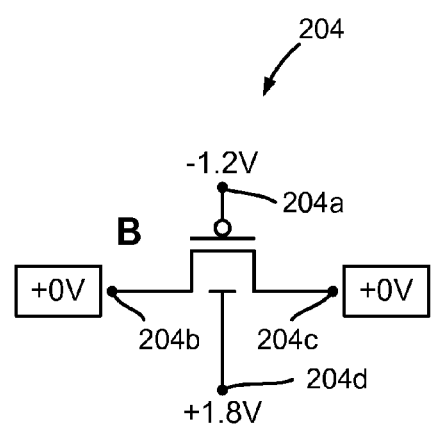
Figure 3C:
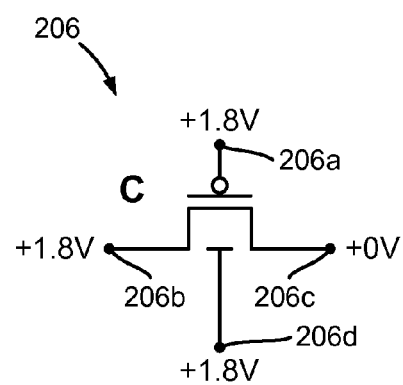
Figure 3D:
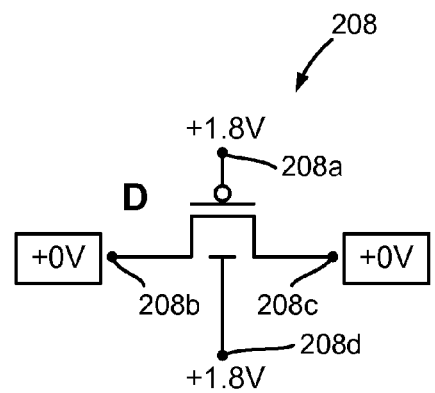

In FIG. 3B, which illustrates a PMOS transistor 204 in the B state of a program condition, the gate 204a of the PMOS transistor 204 has a voltage of approximately −1.2V, the source 204b and the drain 204c of the PMOS transistor 204 have a voltage of approximately 0V, and the N-well 204d of the PMOS transistor 204 has a voltage of approximately +1.8V. In FIG. 3C, which illustrates a PMOS transistor 206 in the C state of a program condition, the gate 206a and the source 206b of the PMOS transistor 206 have a voltage of approximately +1.8V, the drain 206c of the PMOS transistor 206 has a voltage of approximately 0V, and the N-well 206d of the PMOS transistor 206 has a voltage of approximately +1.8V. In FIG. 3D, which illustrates a PMOS transistor 208 in the D state of a program condition, the gate 208a of the PMOS transistor 208 has a voltage of approximately +1.8V, the source 208b and the drain 208c of the PMOS transistor 208 have a voltage of approximately 0V, and the N-well 208d of the PMOS transistor 208 has a voltage of approximately +1.8V.

Figure 4:
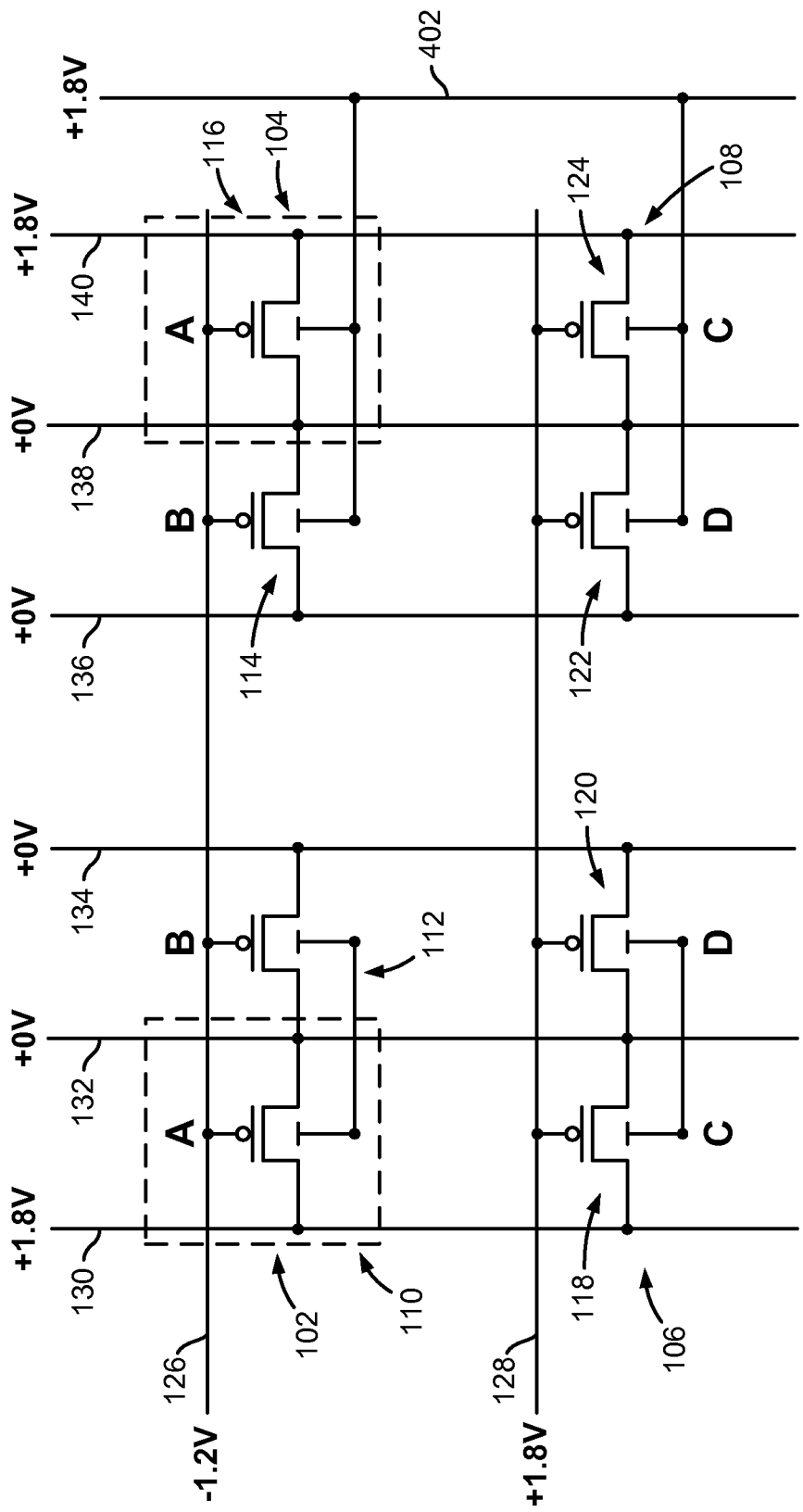
FIG. 4 is a circuit diagram illustrating an embodiment of a differential OTP memory array comprising a plurality of two-transistor (2T) OTP memory cells in program operations.

FIG. 4 is a circuit diagram illustrating an embodiment of a memory array comprising a plurality of differential one-time-programmable (OTP) memory cells, each of the differential OTP memory cells having a two-transistor (2T) structure with two PMOS transistors. In an embodiment, the circuit diagram of FIG. 4 is similar to the circuit diagram of FIG. 1 except that FIG. 4 illustrates program operations in which each of the PMOS transistors is in one of the A, B, C and D states as illustrated in FIGS. 3A-D and described above. In FIG. 4, the first word line 126 is applied a negative voltage, for example, a voltage of approximately −1.2V, whereas the second word line 128 is applied a positive voltage, for example, a voltage of approximately +1.8V. Among vertical lines 130, 132, 134, 136, 138 and 140, lines 130 and 140 serve as source lines which are applied a positive voltage, for example, a voltage of approximately +1.8V in the embodiment shown in FIG. 4, whereas lines 132, 134, 136 and 138 have a voltage of approximately 0V. Moreover, an N-well line 402 is provided in the embodiment shown in FIG. 4 to supply a positive voltage, for example, a voltage of approximately +1.8V, to all of the PMOS transistors in the OTP memory array.

In FIG. 4, the first PMOS transistor 110 in the first OTP memory cell 102 has a gate voltage of approximately −1.2V, a source voltage of approximately +1.8V, a drain voltage of approximately 0V, and an N-well voltage of approximately +1.8V, and thus is in the A state of the program operation. The second PMOS transistor 112 in the first OTP memory cell 102 has a gate voltage of approximately −1.2V, a source voltage of approximately 0V, a drain voltage of approximately 0V, and an N-well voltage of approximately +1.8V, and thus is in the B state of the program operation.

Similarly, the first PMOS transistor 114 in the second OTP memory cell 104 also has a gate voltage of approximately −1.2V, a source voltage of approximately 0V, a drain voltage of approximately 0V, and an N-well voltage of approximately +1.8V, and thus is also in the B state of the program operation. The second PMOS transistor 116 in the second OTP memory cell 104 has a gate voltage of approximately −1.2V, a source voltage of approximately +1.8V, a drain voltage of approximately 0V, and an N-well voltage of approximately +1.8V, and thus is in the A state of the program operation. As shown in FIG. 4, among the first row of OTP memory cells, the first and second PMOS transistors 110 and 112 in the OTP memory cell 102 operate in the A and B states, respectively, whereas the first and second PMOS transistors 114 and 116 in the OTP memory cell 104 operate in the B and A states, respectively.

In FIG. 4, the OTP memory cells 106 and 108 in the second row have PMOS transistors operating in the C and D states of the program operation. The first PMOS transistor 118 in the third OTP memory cell 106 has a gate voltage of approximately +1.8V, a source voltage of approximately +1.8V, a drain voltage of approximately 0V, and an N-well voltage of approximately +1.8V, and thus is in the C state of the program operation. The second PMOS transistor 120 in the third OTP memory cell 106 has a gate voltage of approximately +1.8V, a source voltage of approximately 0V, a drain voltage of approximately 0V, and an N-well voltage of approximately +1.8V, and thus is in the D state of the program operation.

Similarly, the first PMOS transistor 122 in the fourth OTP memory cell 108 also has a gate voltage of approximately +1.8V, a source voltage of approximately 0V, a drain voltage of approximately 0V, and an N-well voltage of approximately +1.8V, and thus is also in the D state of the program operation. The second PMOS transistor 124 in the fourth OTP memory cell 108 has a gate voltage of approximately +1.8V, a source voltage of approximately +1.8V, a drain voltage of approximately 0V, and an N-well voltage of approximately +1.8V, and thus is in the C state of the program operation. As shown in FIG. 4, among the second row of OTP memory cells, the first and second PMOS transistors 118 and 120 in the OTP memory cell 106 operate in the C and D states, respectively, whereas the first and second PMOS transistors 122 and 124 in the OTP memory cell 108 operate in the D and C states, respectively.

As illustrated in FIGS. 3A-D and FIG. 4, each of the PMOS transistors in each of the 2T OTP memory cells is configured to operate in one of four states, namely, the A state, the B state, the C state and the D state, in program operations. Each of the four states comprises a unique set of source voltage, drain voltage and gate voltage, while the N-well voltage is set at approximately +1.8V for all of the four states in program operations. In the embodiments shown in FIGS. 3A-D and FIG. 4, the gate voltage in program operations is either a first word line voltage, for example, a negative voltage of approximately −1.2V, in two of the four states of program operations, namely, the A state and the B state, or a second word line voltage, for example, a positive voltage of approximately +1.8V, in the other two states of program operations, namely, the C state and the D state. Moreover, in program operations, the source voltage is either a first source voltage, for example, a positive voltage of approximately +1.8V, in two of the four states of program operations, namely, the A state and the C state, or a second source voltage, for example, a voltage of approximately 0V, in the other two states of program operations, namely, the B state and the D state. As shown in FIGS. 3A-D and FIG. 4, the drain voltage of the PMOS transistors is approximately 0V in the A, B, C and D states of program operations.

Figure 5:
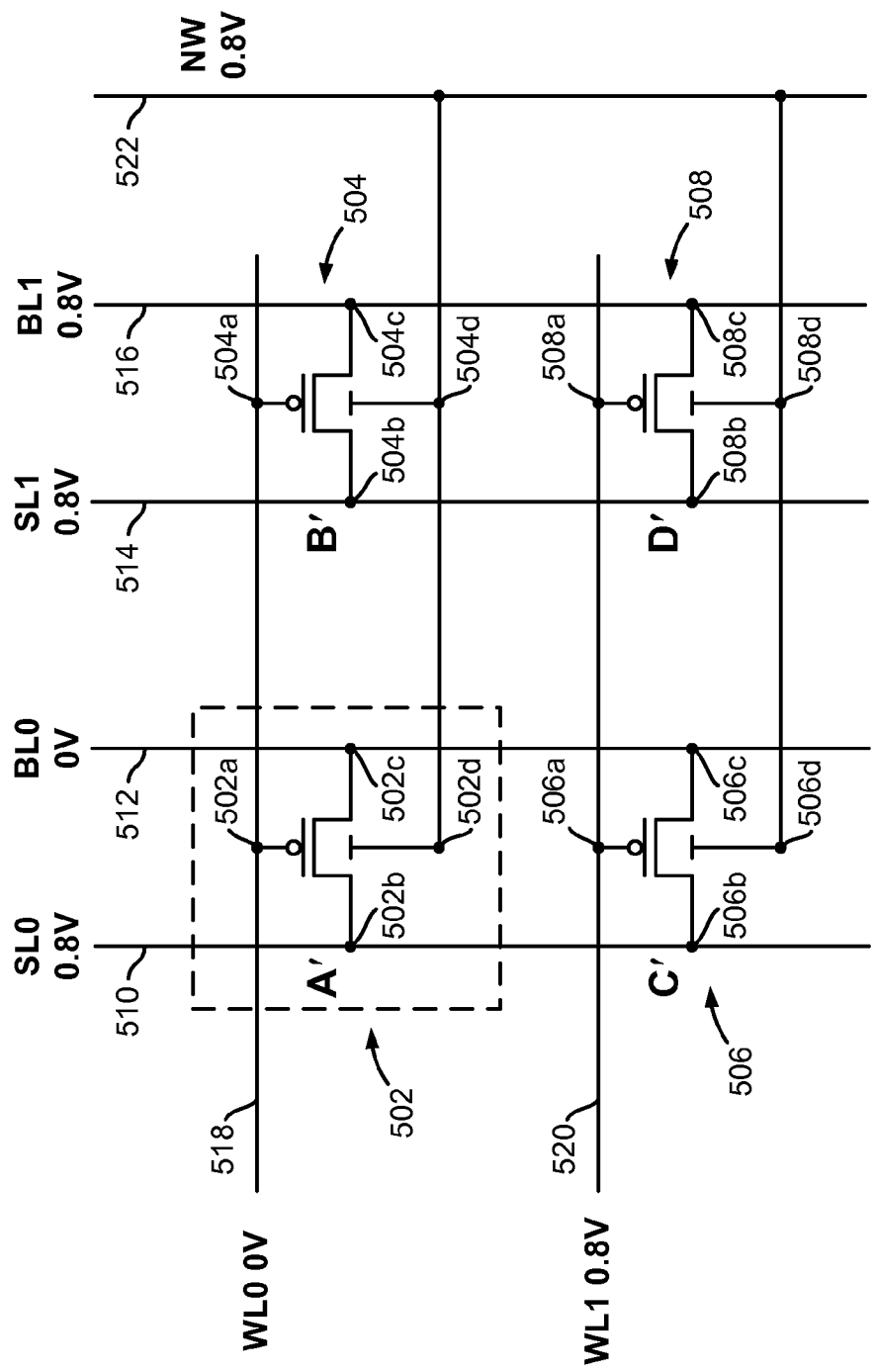
FIG. 5 is a circuit diagram illustrating an OTP memory structure having four 1T OTP memory cells configured to operate in one of four states, namely, the A', B', C' and D' states, of exemplary read conditions.

FIG. 5 is a circuit diagram illustrating an OTP memory structure having four 1T OTP memory cells each comprising a single PMOS transistor configured to operate in one of four states, namely, the A' state, the B' state, the C' state and the D' state, of exemplary read conditions. As illustrated in FIG. 5, a first PMOS transistor 502 having a gate 502a, a source 502b, a drain 502c and an N-well 502d operates in the A' state, a second PMOS transistor 504 having a gate 504a, a source 504b, a drain 504c and an N-well 504d operates in the B' state, a third PMOS transistor 506 having a gate 506a, a source 506b, a drain 506c and an N-well 506d operates in the C' state, and a fourth PMOS transistor 508 having a gate 508a, a source 508b, a drain 508c and an N-well 508d operates in the D' state.

In FIG. 5, a first source line (SL0) 510 is connected to the sources 502b and 506b, and a first bit line (BL0) 512 is connected to the drains 502c and 506c of the first and third PMOS transistors 502 and 506 in the first column, respectively. Similarly, a second source line (SL1) 514 is connected to the sources 504b and 508b, and a second bit line (BL1) 516 is connected to the drains 504c and 508c of the second and fourth PMOS transistors 504 and 508 in the second column, respectively. Moreover, a first word line (WL0) 518 is connected to the gates 502a and 504a of the first and second PMOS transistors 502 and 504 in the first row, respectively, whereas a second word line (WL1) 520 is connected to the gates 506a and 508a of the third and fourth PMOS transistors 506 and 508 in the second row, respectively. Furthermore, the N-wells 502d, 504d, 506d and 508d of the first, second, third and fourth PMOS transistors 502, 504, 506 and 508 are connected to an N-well line (NW) 522.

In an embodiment, the first word line (WL0) 518 is applied a voltage of approximately 0V, whereas the second word line (WL1) 520 is applied a positive voltage, for example, a voltage of approximately +0.8V, in read conditions. In an embodiment, the first source line (SL0) 510, the second source line (SL1) 514 and the second bit line (BL1) 516 have a positive voltage, for example, a voltage of approximately +0.8V, whereas the first bit line (BL0) 512 has a voltage of approximately 0V. In an embodiment, the N-well line (NW) 522 is applied a positive voltage of approximately +0.8V, which is supplied to the N-wells of all PMOS transistors in read conditions regardless of whether each PMOS transistor is in the A' state, the B' state, the C' state or the D' state.

Figure 6A:
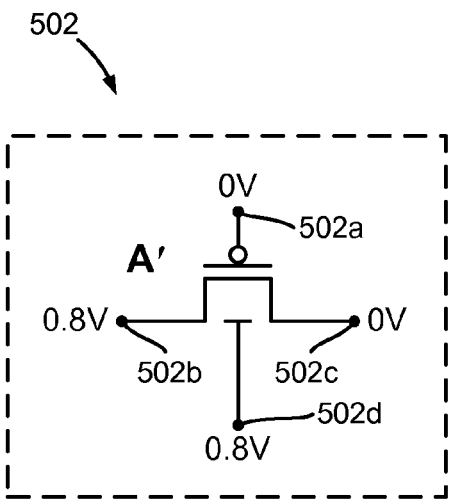
FIGS. 6A-D illustrate the voltages at the gate, source, drain and N-well of four PMOS transistors in the A', B', C' and D' states of exemplary read conditions, respectively.

FIGS. 6A-D each illustrate the voltages at the gate, source, drain and N-well of each of the four PMOS transistors 502, 504, 506 and 508 in the A', B', C' and D' states of exemplary read conditions, respectively. In FIG. 6A, which illustrates a PMOS transistor 502 in the A' state of a read condition, the gate 502a of the PMOS transistor 502 has a voltage of approximately 0V, which may be supplied from a word line in an embodiment, the source 502b of the PMOS transistor 502 has a voltage of approximately +0.8V, which may be supplied from a source line in an embodiment, the drain 502c of the PMOS transistor 502 has a voltage of approximately 0V, and the N-well 502d of the PMOS transistor 502 has a voltage of approximately +0.8V, which may be supplied from an N-well line in an embodiment.

Figure 6B:
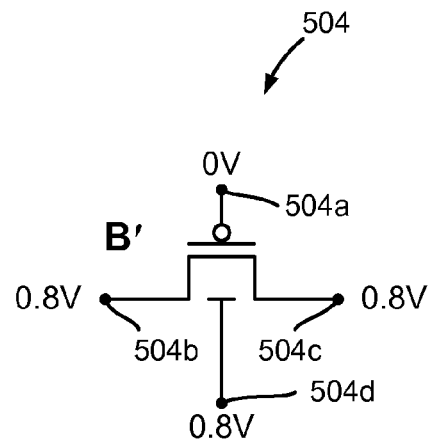
Figure 6C:
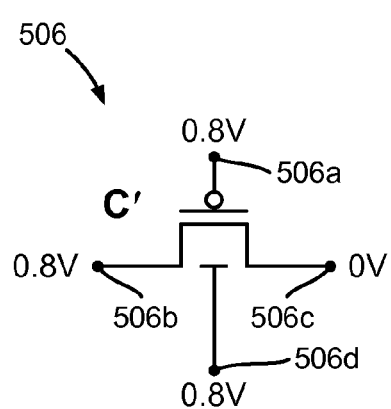
Figure 6D:
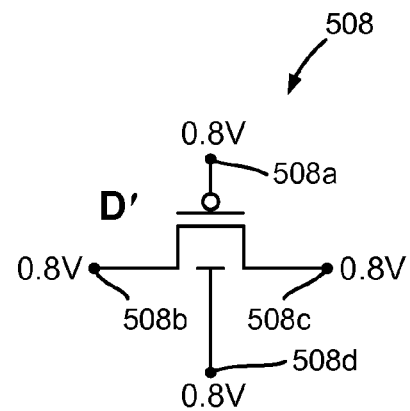

In FIG. 6B, which illustrates a PMOS transistor 504 in the B' state of a read condition, the gate 504a of the PMOS transistor 504 has a voltage of approximately 0V, the source 504b and the drain 504c of the PMOS transistor 504 have a voltage of approximately +0.8V, and the N-well 504d of the PMOS transistor 504 has a voltage of approximately +0.8V. In FIG. 6C, which illustrates a PMOS transistor 506 in the C' state of a read condition, the gate 506a and the source 506b of the PMOS transistor 506 have a voltage of approximately +0.8V, the drain 506c of the PMOS transistor 506 has a voltage of approximately 0V, and the N-well 506d of the PMOS transistor 506 has a voltage of approximately +0.8V. In FIG. 6D, which illustrates a PMOS transistor 508 in the D' state of a read condition, the gate 508a, the source 506b, the drain 508c and the N-well 508d of the PMOS transistor 508 have a voltage of approximately +0.8V.

Figure 7:
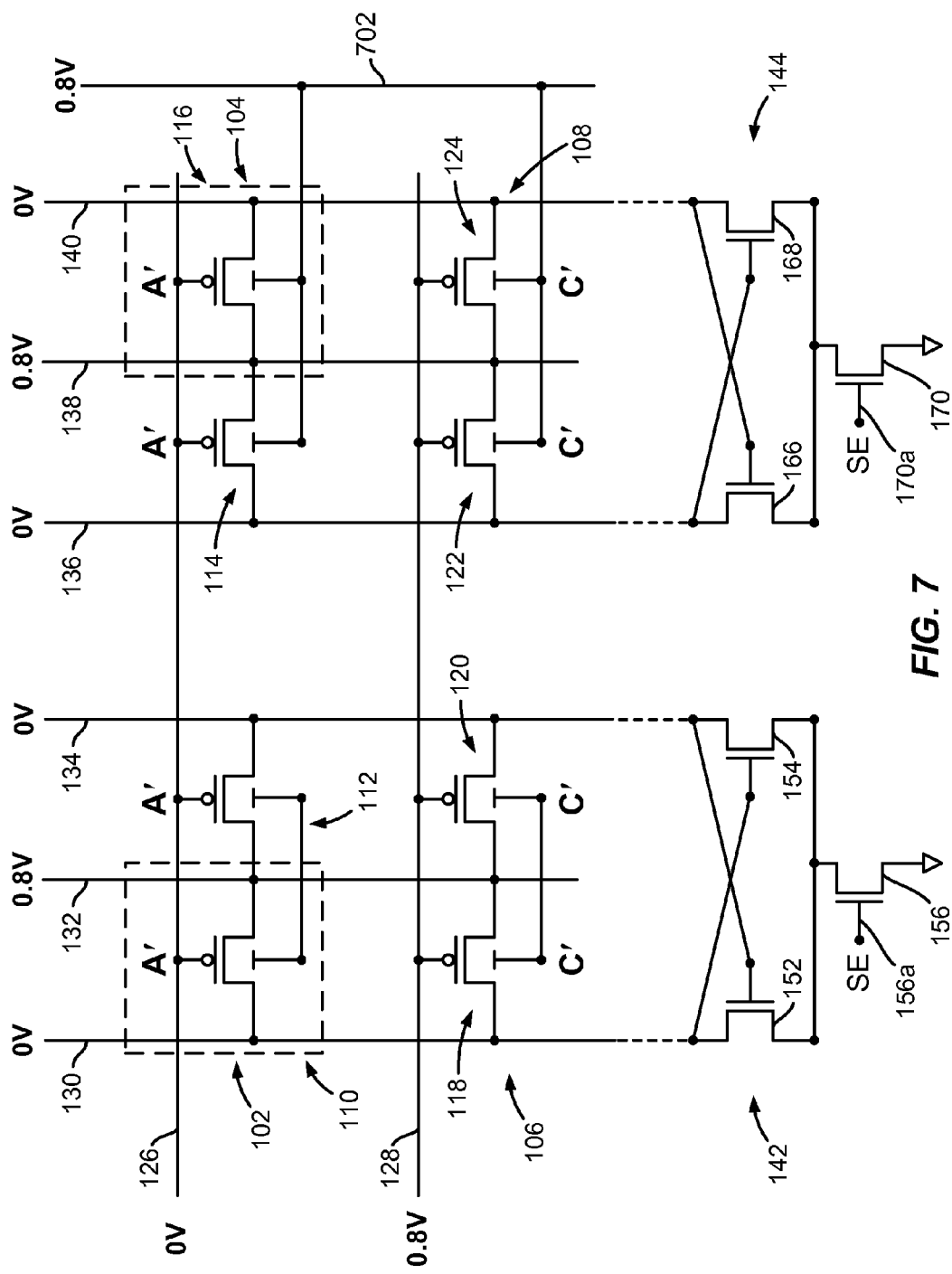
FIG. 7 is a circuit diagram illustrating an embodiment of a differential OTP memory array comprising a plurality of 2T OTP memory cells in read operations.

FIG. 7 is a circuit diagram illustrating an embodiment of a memory array comprising a plurality of differential one-time-programmable (OTP) memory cells, each of the differential OTP memory cells having a two-transistor (2T) structure with two PMOS transistors similar to FIGS. 1 and 4 but configured for read operations. The circuit in the embodiment shown in FIG. 7 is capable of performing read operations in which each of the PMOS transistors may be in one of two states, namely, the A' state and the C' state, as illustrated in FIGS. 6A and 6C and described above. In this embodiment, the B' state and the D' state as illustrated in FIGS. 6B and 6D are not used in read operations in the 2T OTP memory array as shown in FIG. 7. In FIG. 7, the first word line 126 has a voltage of 0V, whereas the second word line 128 is applied a positive voltage, for example, a voltage of approximately +0.8V.

Among vertical lines 130, 132, 134, 136, 138 and 140, lines 132 and 138 serve as source lines which are applied a positive voltage, for example, a voltage of approximately +0.8V in the embodiment shown in FIG. 7. Lines 130 and 134 serve as the bit line and the complementary bit line, respectively, for the OTP memory cells 102 and 106 in the first column, whereas lines 136 and 140 serve as the bit line and the complementary bit line, respectively, for the OTP memory cells 104 and 108 in the second column. The bit lines and complementary bit lines have a voltage of approximately 0V, although a latching circuit or a sense amplifier may be implemented to sense a small difference in voltage between the bit line and the complementary bit line for a respective column of memory cells in read operations.

Moreover, an N-well line 702 is provided in the embodiment shown in FIG. 7 to supply a positive voltage, for example, a voltage of approximately +0.8V, to all of the PMOS transistors in the OTP memory array. In FIG. 7, the first PMOS transistor 110 in the first OTP memory cell 102 has a gate voltage of approximately 0V, a source voltage of approximately +0.8V supplied by the source line 132, a drain voltage of approximately 0V, and an N-well voltage of approximately +0.8V, and thus is in the A' state of the read operation. Similarly, the second PMOS transistor 112 in the first OTP memory cell 102 has a gate voltage of approximately 0V, a source voltage of approximately +0.8V also supplied by the source line 132, a drain voltage of approximately 0V, and an N-well voltage of approximately +0.8V, and thus is also in the A' state of the read operation.

In a similar manner, the first PMOS transistor 114 in the second OTP memory cell 104 also has a gate voltage of approximately 0V, a source voltage of approximately +0.8V supplied by the source line 138, a drain voltage of approximately 0V, and an N-well voltage of approximately +0.8V, and thus is in the A' state of the read operation. The second PMOS transistor 116 in the second OTP memory cell 104 has a gate voltage of approximately 0V, a source voltage of approximately +0.8V also supplied by the source line 138, a drain voltage of approximately 0V, and an N-well voltage of approximately +0.8V, and thus is also in the A' state of the read operation. As shown in FIG. 7, all of the PMOS transistors 110, 112, 114 and 116 in the first row of OTP memory cells 102 and 104 operate in the A' state of the read operation.

In FIG. 7, the OTP memory cells 106 and 108 in the second row have all of the PMOS transistors operating in the C' state of the read operation. The first PMOS transistor 118 in the third OTP memory cell 106 has a gate voltage of approximately +0.8V, a source voltage of approximately +0.8V supplied by the source line 132, a drain voltage of approximately 0V, and an N-well voltage of approximately +0.8V, and thus is in the C' state of the read operation. Similarly, the second PMOS transistor 120 in the third OTP memory cell 106 also has a gate voltage of approximately +0.8V, a source voltage of approximately +0.8V also supplied by the source line 132, a drain voltage of approximately 0V, and an N-well voltage of approximately +0.8V, and thus is also in the C' state of the read operation.

The PMOS transistors 122 and 124 in the fourth OTP memory cell 108 are also in the C' state of the read operation. The first PMOS transistor 122 in the fourth OTP memory cell 108 has a gate voltage of approximately +0.8V, a source voltage of approximately +0.8V supplied by the source line 138, a drain voltage of approximately 0V, and an N-well voltage of approximately +0.8V, and thus is in the C' state of the read operation. The second PMOS transistor 124 in the fourth OTP memory cell 108 also has a gate voltage of approximately +0.8V, a source voltage of approximately +0.8V also supplied by the source line 138, a drain voltage of approximately 0V, and an N-well voltage of approximately +0.8V, and thus is also in the C' state of the read operation.

As illustrated in FIGS. 6A, 6C and 7, each of the PMOS transistors in each of the 2T OTP memory cells is configured to operate in one of two states, namely, the A' state and the C' state, in read operations. Each of the two states comprises a unique set of source voltage, drain voltage and gate voltage, while the N-well voltage is set at approximately +0.8V for all of the states in read operations. In the embodiments shown in FIGS. 6A, 6C and 7, the gate voltage in read operations is either a first word line voltage, for example, a voltage of approximately 0V, in the A' state of the read operation, or a second word line voltage, for example, a positive voltage of approximately +0.8V, in the C' state of the read operation. Moreover, in read operations, the source voltage is approximately +0.8V in both the A' state and the C' state. As shown in FIGS. 6A, 6C and 7, the drain voltage of the PMOS transistors is approximately 0V in the A' and C' states of read operations.

In the embodiment of read operations illustrated in FIG. 7, the OTP memory array further comprises a plurality of latching circuits 142 and 144. The first latching circuit 142 is coupled to the bit line 130 and the complementary bit line 134 for the first and third OTP memory cells 102 and 106 in the first column. The bit line 130 is connected to the terminals serving as drains of the PMOS transistors 110 and 118, whereas the complementary bit line 134 is connected to the terminals serving as drains of the PMOS transistors 112 and 120 in read operations. In a similar manner, the second latching circuit 144 is coupled to the bit line 136 and the complementary bit line 140 for the second and fourth OTP memory cells 104 and 108 in the second column. The bit line 136 is connected to the terminals serving as drains of the PMOS transistors 114 and 122, whereas the complementary bit line 140 is connected to the terminals serving as drains of the PMOS transistors 116 and 124 in read operations.

In an embodiment, each of the latching circuits comprises a plurality of N-channel metal oxide semiconductor (NMOS) transistors. In the embodiment shown in FIG. 7, the first latching circuit 142 comprises two cross-coupled NMOS transistors 152 and 154 and an NMOS transistor 156 connected to the cross-coupled NMOS transistors 152 and 154. In an embodiment, the NMOS transistor 156 has a gate 156a which may be applied a control voltage (SE) to initiate or end a read operation for the OTP memory cells 102 and 106 in the first column. In a similar manner, the second latching circuit 144 comprises two cross-coupled NMOS transistors 166 and 168 and an NMOS transistor 170 connected to the cross-coupled NMOS transistors 166 and 168 in the embodiment shown in FIG. 7. In an embodiment, the NMOS transistor 170 has a gate 170a which may be applied a control voltage (SE) to initiate or end a read operation for the OTP memory cells 104 and 108 in the second column Other types of latching circuits or sense amplifiers may also be implemented for reading operations in various embodiments within the scope of the disclosure. In an embodiment, a read operation is performed by a sequence of first turning on the word line for the row to which a memory cell belongs is to be read, and then turning on the source line for that memory cell and the control voltage (SE) for the latching circuit coupled to the bit line and the complementary bit line for that memory cell.

The differential OTP memory arrays according to embodiments described above are capable of providing sufficiently large margins over global process variations or temperature variations and are also capable of further enlarging switch windows. According to embodiments of the disclosure, the OTP memory cells along a pair of bit line and complementary bit line in a given column share a latching circuit to allow for an increase in array density. The latching circuits according to embodiments of the disclosure are capable of providing self-amplification of threshold voltage ($V_T$) mismatch after programming, thereby greatly simplifying the design of periphery circuits. Moreover, the differential OTP memory arrays according to embodiments described above are fully compatible with standard logic fin-shaped field effect transistor (FinFET) processes while obviating the need for additional masks and costs associated with additional masks.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A differential one-time-programmable (OTP) memory, comprising:
    a first transistor and a second transistor coupled to each other,
    wherein each of the first and second transistors comprises a source, a drain and a gate,
    wherein each of the first and second transistors is configured to operate in one of four program states of a program operation,
    wherein each of the four program states of the program operation comprises a unique set of a program source voltage, a program drain voltage and a program gate voltage,
    wherein the program gate voltage is either a first program word line voltage in first and second of the four program states of the program operation or a second program word line voltage in third and fourth of the four program states of the program operation, and
    wherein the program source voltage is either a first program source voltage in the first and third of the four program states of the program operation or a second program source voltage in the second and fourth of the four program states of the program operation.

2. The differential OTP memory of claim 1,
    wherein each of the first and second transistors comprises a P-channel metal oxide semiconductor (PMOS) transistor comprising an N-well, and
    wherein the N-well of the first transistor and the N-well of the second transistor are coupled to each other.

3. The differential OTP memory of claim 2, wherein the N-well of the first transistor and the N-well of the second transistor are configured to be supplied a program N-well voltage greater than 0V in the program operation.

4. The differential OTP memory of claim 2, wherein the N-well of the first transistor and the N-well of the second transistor are configured to be supplied a read N-well voltage greater than 0V in a read operation.

5. The differential OTP memory of claim 1,
    wherein for each of the four program states of the program operation,
        the program source voltage is one of the first program source voltage and the second program source voltage, the first program source voltage being greater than 0V, and the second program source voltage being less than the first program source voltage,
        the program drain voltage is a program bit voltage, the program bit voltage being less than the first program word line voltage, and
        the program gate voltage is one of the first program word line voltage and the second program word line voltage, the first program word line voltage being less than 0V and less than the second program source voltage, and the second program word line voltage being greater than 0V, and
    wherein in the first program state of the program operation, the program source voltage is equal to the first program source voltage, the program drain voltage is equal to the program bit voltage, and the program gate voltage is equal to the first program word line voltage.

6. The differential OTP memory of claim 5, wherein in the second program state of the program operation, the program source voltage is equal to the second program source voltage, the program drain voltage is equal to the program bit voltage, and the program gate voltage is equal to the first program word line voltage.

7. The differential OTP memory of claim 6, wherein in the third program state of the program operation, the program source voltage is equal to the first program source voltage, the program drain voltage is equal to the program bit voltage, and the program gate voltage is equal to the second program word line voltage.

8. The differential OTP memory of claim 7, wherein in the fourth program state of the program operation, the program source voltage is equal to the second program source voltage, the program drain voltage is equal to the program bit voltage, and the program gate voltage is equal to the second program word line voltage.

9. The differential OTP memory of claim 1,
    wherein each of the first and second transistors is configured to operate in one of two read states of a read operation, and
    wherein each of the two read states of the read operation comprises a unique set of a read source voltage, a read drain voltage and a read gate voltage.

10. The differential OTP memory of claim 9,
    wherein for each of the two read states of the read operation,
        the read source voltage is one of a first read source voltage and a second read source voltage, the first read source voltage being greater than 0V, and the second read source voltage being less than the first read source voltage,
        the read drain voltage is a read bit voltage, the read bit voltage being less than the first read source voltage, and
        the read gate voltage is one of a first read word line voltage and a second read word line voltage, the first read word line voltage being less than the first read source voltage, and the second read word line voltage being greater than 0V and greater than the first read word line voltage, and wherein in a first read state of the read operation, the read source voltage is equal to the first read source voltage, the read drain voltage is equal to the read bit voltage, and the read gate voltage is equal to the first read word line voltage.

11. The differential OTP memory of claim 10, wherein in a second read state of the read operation, the read source voltage of is equal to the first read source voltage, the read drain voltage is equal to the read bit voltage, and the read gate voltage is equal to the second read word line voltage.

12. A differential one-time-programmable (OTP) memory, comprising:
a plurality of differential memory cells each comprising at least a first P-channel metal oxide semiconductor (PMOS) transistor and a second PMOS transistor coupled to each other,
wherein each of the first and second PMOS transistors comprises a source, a drain and a gate,
wherein each of the first and second PMOS transistors is configured to operate in one of four program states of a program operation,
wherein each of the four program states of the program operation comprises a unique set of a program source voltage, a program drain voltage and a program gate voltage,
wherein each of the first and second PMOS transistors is configured to operate in one of two read states of a read operation, and
wherein each of the two read states of the read operation comprises a unique set of a read source voltage, a read drain voltage and a read gate voltage.

13. The differential OTP memory of claim 12,
wherein each of the first and second PMOS transistors comprises an N-well, and
wherein the N-well of the first PMOS transistor and the N-well of the second PMOS transistor are coupled to each other.

14. The differential OTP memory of claim 13, wherein the N-well of the first PMOS transistor and the N-well of the second PMOS transistor are configured to be supplied a program N-well voltage greater than 0V in the program operation.

15. The differential OTP memory of claim 13, wherein the N-well of the first PMOS transistor and the N-well of the second PMOS transistor are configured to be supplied a read N-well voltage greater than 0V in a read operation.

16. The differential OTP memory of claim 12,
wherein for each of the four program states of the program operation,
the program source voltage is one of a first program source voltage and a second program source voltage, the first program source voltage being greater than 0V, and the second program source voltage being less than the first program source voltage,
the program drain voltage is a program bit voltage, the program bit voltage being less than a first program word line voltage, and
the program gate voltage is one of the first program word line voltage and a second program word line voltage, the first program word line voltage being less than 0V and less than the second program source voltage, and the second program word line voltage being greater than 0V,
wherein in the first program state of the program operation, the program source voltage is equal to the first program source voltage, the program drain voltage is equal to the program bit voltage, and the program gate voltage is equal to the first program word line voltage,
wherein in the second program state of the program operation, the program source voltage is equal to the second program source voltage, the program drain voltage is equal to the program bit voltage, and the program gate voltage is equal to the first program word line voltage,
wherein in the third program state of the program operation, the program source voltage is equal to the first program source voltage, the program drain voltage is equal to the program bit voltage, and the program gate voltage is equal to the second program word line voltage, and
wherein in the fourth program state of the program operation, the program source voltage is equal to the second program source voltage, the program drain voltage is equal to the program bit voltage, and the program gate voltage is equal to the second program word line voltage.

17. The differential OTP memory of claim 12,
wherein for each of the two read states of the read operation,
the read source voltage is one of a first read source voltage and a second read source voltage, the first read source voltage being greater than 0V, and the second read source voltage being less than the first read source voltage,
the read drain voltage is a read bit voltage, the read bit voltage being less than the first read source voltage, and
the read gate voltage is one of a first read word line voltage and a second read word line voltage, the first read word line voltage being less than the first read source voltage, and the second read word line voltage being greater than 0V and greater than the first read word line voltage,
wherein in a first read state of the read operation, the read source voltage is equal to the first read source voltage, the read drain voltage is equal to the read bit voltage, and the read gate voltage is equal to the first read word line voltage, and
wherein in a second read state of the read operation, the read source voltage of is equal to the first read source voltage, the read drain voltage is equal to the read bit voltage, and the read gate voltage is equal to the second read word line voltage.

18. A one-time-programmable (OTP) memory, comprising:
a plurality of word lines;
a plurality of bit lines;
a plurality of differential memory cells each comprising at least a first P-channel metal oxide semiconductor (PMOS) transistor and a second PMOS transistor,
wherein each of the first and second PMOS transistors comprises a source, a drain and a gate,
wherein the gate of the first PMOS transistor and the gate of the second PMOS transistor are coupled to one of the plurality of word lines,
wherein the drain of the first PMOS transistor is coupled to a first bit line of the plurality of bit lines and the drain of the second PMOS transistor is coupled to a second bit line of the plurality of bit lines,
wherein each of the first and second PMOS transistors is configured to operate in one of four program states of a program operation, wherein each of the four program states of the program operation comprises a unique set of a program source voltage, a program drain voltage and a program gate voltage, wherein each of the first and second PMOS transistors is configured to operate in one of two read states of a read operation, and wherein each of the two read states of the read operation comprises a unique set of a read source voltage, a read drain voltage and a read gate voltage; and a latching circuit coupled to the first and second bit lines of the plurality of bit lines.

19. The OTP memory of claim 18, wherein the latching circuit comprises a plurality of N-channel metal oxide semiconductor (NMOS) transistors, and wherein at least two of the NMOS transistors of the latching circuit are cross-coupled to each other.

20. The OTP memory of claim 18, wherein the program gate voltage is either a first program word line voltage in first and second program states of the program operation or a second program word line voltage in third and fourth program states of the program operation, and wherein the program source voltage is either a first program source voltage in the first and third program states of the program operation or a second program source voltage in the second and fourth program states of the program operation.

* * * * *